United States Patent [19]

Allemann et al.

[11] Patent Number: 4,464,570
[45] Date of Patent: Aug. 7, 1984

[54] METHOD FOR ION CYCLOTRON RESONANCE SPECTROSCOPY

[76] Inventors: Martin Allemann, CH 8311 Ottikon, Hanspeter Kellerhals, CH 8610 Uster, both of Switzerland

[21] Appl. No.: 390,050

[22] Filed: Jun. 18, 1982

[30] Foreign Application Priority Data

Jun. 22, 1981 [DE] Fed. Rep. of Germany ....... 3124465

[51] Int. Cl.³ ...................... B01D 59/44; H01J 49/00
[52] U.S. Cl. .................................... 250/291; 250/282
[58] Field of Search ........................ 250/291, 282, 288

[56] References Cited

U.S. PATENT DOCUMENTS 3,639,757 2/1972 Caroll et al. .................. 250/288 X

OTHER PUBLICATIONS

Lehman et al., *Ion Cyclotron Resonance Spectrometry*, 1976, pp. 175-180.

*Primary Examiner*—Alfred E. Smith
*Assistant Examiner*—Jack I. Berman
*Attorney, Agent, or Firm*—Burmeister, York, Palmatier, Hamby & Jones

[57] ABSTRACT

In ion cyclotron resonance spectroscopy, a gaseous sample substance contained in a measuring cell and exposed to a constant magnetic field therein is ionized and is subsequently subjected to an electric HF measuring field oriented orthogonally to the magnetic field. The frequencies of the electric field encompass the frequencies of the cyclotron resonance frequencies of the ions of the sample substance. Sample substances often include ions which are of no interest to the material under study but which produce very strong lines that can be highly disturbing because of the limited dynamics of the spectrometer and, especially, the relatively low concentration of ions in the measuring cell which is necessary to prevent space charge effects. To avoid such disturbances, the sample substance is subjected to a HF selection field, prior to applying the HF measuring field, which selection field includes the cyclotron resonance frequency of at least one of the undesired ion species, for a period of time until the orbital radii of the ions of this kind have reached a magnitude at which the ions collide with the walls of the measuring cell and are thereby ejected. By repeating the process of ionization and elimination of the undesired ions, the concentration of the desired ions in the cell can be increased up to the permissible maximum value, resulting in a substantial increase in the sensitivity of the spectrometer.

8 Claims, 4 Drawing Figures

METHOD FOR ION CYCLOTRON RESONANCE SPECTROSCOPY

FIELD OF THE INVENTION

This invention relates to a method for use in ion cyclotron resonance spectroscopy, in which a gaseous sample substance contained in a measuring cell and exposed to a constant magnetic field is ionized and subsequently subjected to an electric high frequency field disposed at right angles to the magnetic field. The frequencies of the electric field encompass the cyclotron resonance frequencies of the ions of the sample substance.

BACKGROUND OF THE INVENTION

Methods and apparatus for ion cyclotron resonance spectroscopy are known, for example, from an article by G. Perisod and T. Gäumann in Chimia 34, 271 (1980) and from German published patent application OS No. 25 46 225. The first named publication describes a method in which the frequency of the high frequency measuring field is continuously varied to determine the cyclotron resonance frequencies. In the method disclosed in the second publication, a wide band excitation of the sample substance is performed, followed by a Fourier transformation analysis of the cyclotron resonance signals obtained from the excitation. The HF signals required for the frequency scanning method according to the first publication may be obtained, for example, by means of a tunable frequency synthesizer, while the wide band excitation signal for the method according to the second publication may be obtained by an appropriate modulation of a HF signal. In both techniques, an improvement in the signal-to-noise ratio may be obtained by repeating the measurement several times and then adding up the produced signals, so that also weak lines can be detected and recorded.

From U.S. Pat. No. 3,535,512 and No. 3,502,867 it is also known to employ a high frequency measuring field having two discrete frequencies which correspond to the cyclotron resonance frequencies of two different species of ions in order to excite these two different kinds of ions to be able to study the interactions occurring between them.

The prior art methods are afflicted with problems which arise from the limited dynamics of a spectrometer. This limited dynamics of a spectrometer is due to the fact that the ion density in the measuring cell must be limited to values at which no adverse space charge effects will occur yet. Since the ionization of a sample substance is usually not selective, the sample substance may include ions which produce very strong lines, but are not of much interest to the particular analysis to be undertaken. This is the case, for instance, where the dominating lines stem from a vehicle gas or a solvent for the substance under study. Moreover, the maximal dynamics of the receiver system of the spectrometer sets further limits as to the highest possible ratio between the strongest line and the weakest line.

SUMMARY OF THE INVENTION

It is therefore the object of the present invention to eliminate the disturbances caused by undesired ions and to increase the sensitivity of an ion cyclotron resonance spectrometer.

This object is achieved according to the invention by exposing the sample substance, prior to the application of the high frequency measuring field, to a HF selection field which includes the cyclotron resonance frequency of at least one interfering ion species, for a period of time until the orbital radii of the ions of this kind reach a magnitude at which the ions collide with the walls of the measuring cell and are thus eliminated.

According to the method of the invention, following ionization of a substance, one or more attendant undesired species of ions are selectively excited and consequently are eliminated. This has the result that, first, the disturbing effect of the strong lines produced by this kind of ions is diminished or even totally cancelled out, while at the same time it is possible to increase the concentration of the desirable ions in the measuring cell to the limit value at which disturbances due to space charge effects must be expected. Thus, for all practical purposes, the measuring cell will contain only the ions of interest to the particular analysis to be performed and which ions are capable of delivering sufficiently strong signals even if they are present in the sample substance only at very low concentration and would normally barely be detectable. It is this fail-safe detection of very weak signals which represents a substantial increase in the sensitivity of the spectrometer.

To effect the elimination of the useless ions and the concentration of the useful ions in the measuring cell, the process of ionizing the sample substance and subsequently eliminating the disturbing ions by means of a HF selection field may be repeated several times before applying the HF measuring field.

Depending on the type of sample substance to be analyzed and the specific objective of the examination, there may be used either HF selection fields having discrete frequencies or wide band HF selection fields. The use of HF selection fields having discrete frequencies is indicated when specific dominating lines of known cyclotron resonance frequencies need to be eliminated, such as, for example, the lines of a vehicle gas or a solvent. If a particular frequency range is under study, a wide band HF selection field will permit the removal of all ions whose cyclotron resonance frequencies lie outside the frequency band of interest, that is, outside a predetermined frequency window. HF selection fields having discrete frequencies may be produced by a frequency synthesizer, for example, while wide band HF selection fields may be produced by modulation of a high frequency signal. The methods and apparatus required are similar to those employed in scan spectrometry or in wide band Fourier spectrometry.

The HF selection field may be applied at least part of the time during which the ionization of the sample is in progress. Thus, in a sense, there is a measure of continuity in the ionization and simultaneous elimination of the unwanted ions. It is desirable to continue with the excitation by the HF selection field past the ionization period because acceleration of the ions required to reach orbits having a radius large enough to bring about elimination takes a certain period of time. In direct ionization, by bombarding the sample substance with an electron beam, for example, the sample may be exposed simultaneously to the electron beam and the HF selection field. If an indirect ionization method is employed, however, the HF selection field is applied only after producing the primary ions.

The method according to the invention is also suitable for use in automatic operation. In that case, the undesired cyclotron resonance frequencies contained in a sample substance are automatically determined by a test measurement, and the frequencies of the HF selection field are adjusted automatically.

BRIEF DESCRIPTION OF THE DRAWING

The invention will be described in further detail with reference to illustrative embodiments of the inventive method as diagrammatically represented in the drawings, in which.

DETAILED DESCRIPTION OF ILLUSTRATIVE EMBODIMENTS

Figure 1:
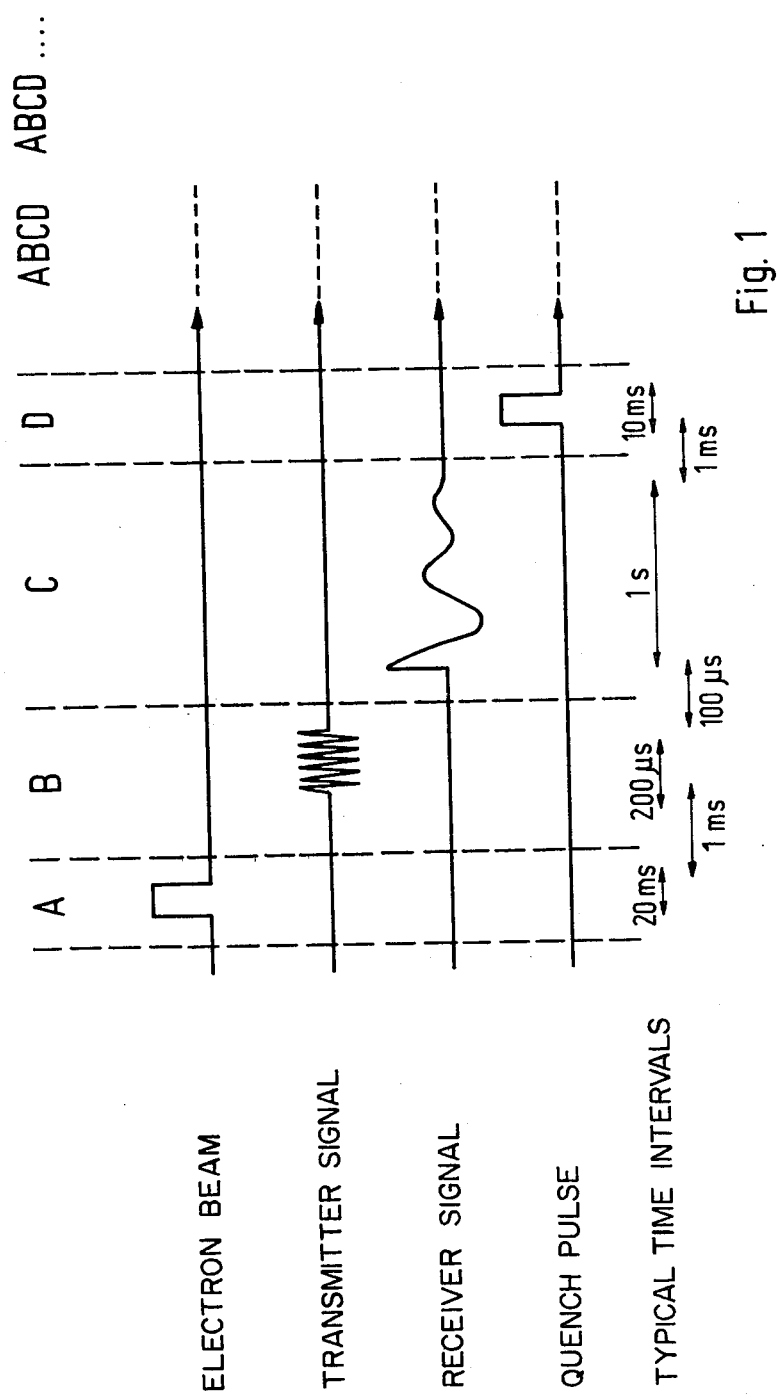
FIG. 1 is a diagram of the time sequence of the signals occurring in Fourier spectroscopy.
Figure 2:
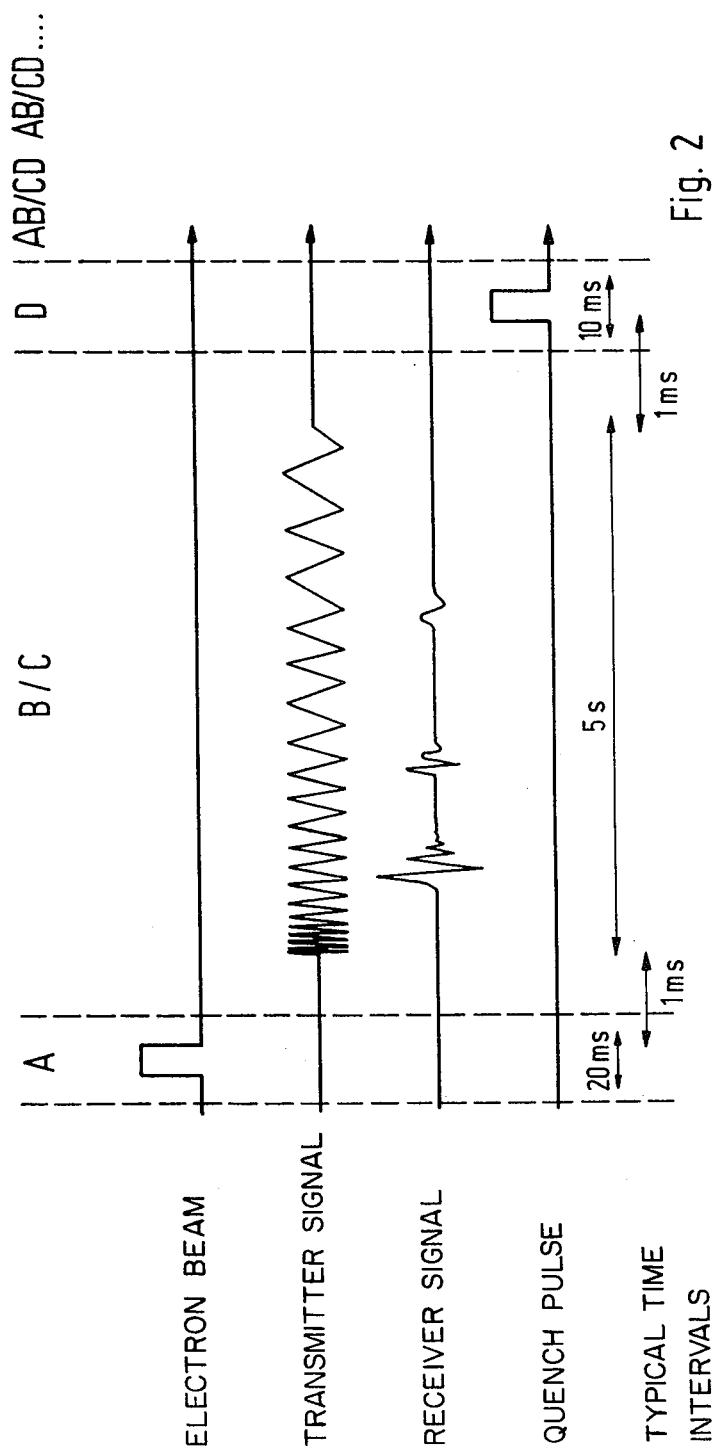
FIG. 2 is a diagram of the time sequence of the signals occurring in scan spectroscopy.

Conventionally, the sequence of signals shown in FIGS. 1 and 2 is used in recording an ion cyclotron resonance spectrum. After ionization in time interval or phase A, the ions produced are selectively excited in phase B by means of a transmitter. The signals generated by the excited ions are supplied to a computer in phase C for further processing. In Fourier spectroscopy, the phases B and C are separated as to time (FIG. 1), while in scan spectroscopy they coincide in time. Thereafter, the ion cell is opened by a quench pulse and the ions are removed from the cell. Now the measuring sequence may be repeated in order to accumulate additional signals in the computer before they are mathematically transformed into a mass spectrum.

Figure 3:
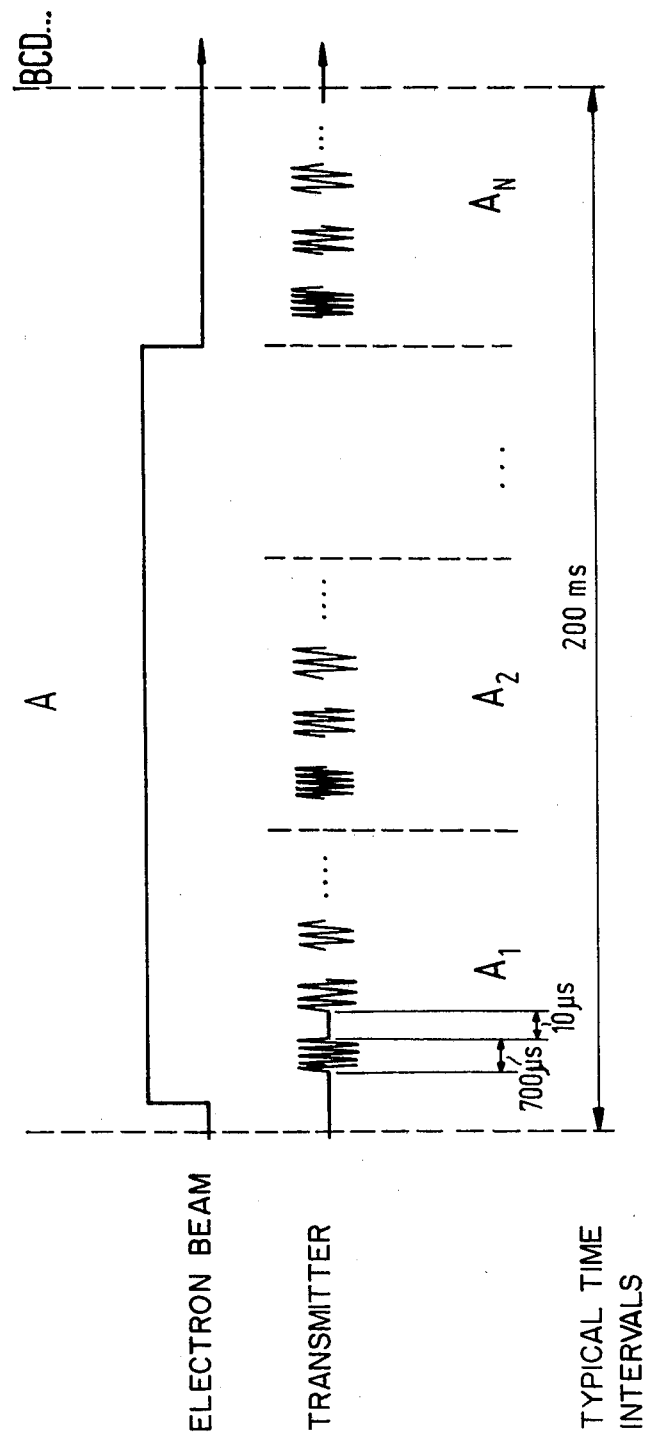
FIG. 3 is a diagram of the modification of the ionization phase A which occurs at the application of the invention to direct ionization.
Figure 4:
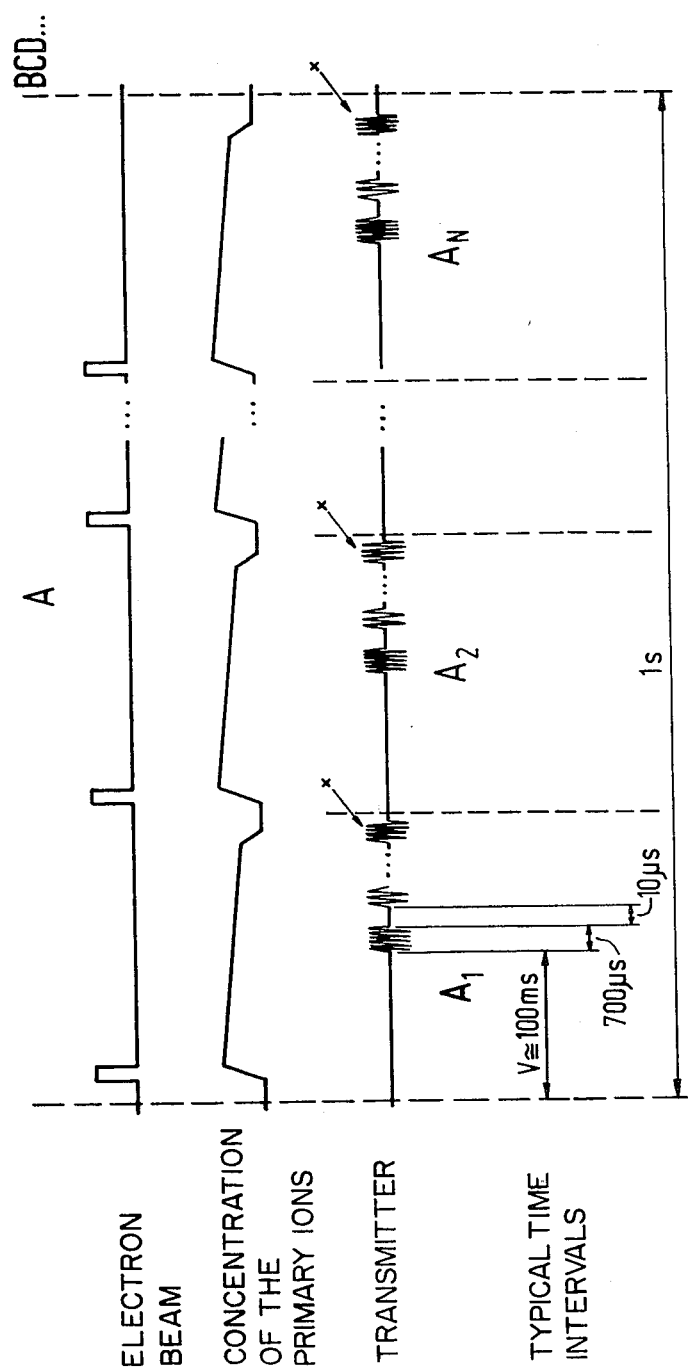
FIG. 4 is a diagram of the modification of the ionization phase A occurring at the application of the invention to indirect ionization.

In employing the method according to the invention, the phases B, C and D of the prior methods remain unchanged. However, the preparation phase A of the methods according to FIGS. 1 and 2 is modified in a manner as shown in FIGS. 3 and 4, in both instances. The procedural steps illustrated in FIG. 3 are applied in the direct excitation of the ions by subjecting them to an electron beam. As will be seen, the sample substance, after turning the electron beam on, undergoes successive excitation by several discrete frequencies which are characteristic of certain generic species of ions not of interest to the particular study to be undertaken. In this manner, ions having cyclotron resonance frequencies which coincide with the frequencies of the HF selection field, are excited to a high degree such that they are ejected from the cell. Remaining in the measuring cell are the ions whose lines are to be recorded. By repeatedly performing the excitation step $A_n$, with $n=1$ to N, it is possible to increase the quantity of desirable ions in the measuring cell. It has been found practical that the final excitation sequence $A_N$ is performed after the electron beam has been turned off. Thereafter, the ion cell contains only the desired ions. In this manner, the problem of dynamics referred to in the foregoing can be overcome and the abundance of the desired ions increased to close to the theoretical limit value determined by the maximum total number of ions. The method according to the invention may therefore be termed "Selective Accumulation of Trapped Ions" or, in short, SATI.

As will be seen from the typical time intervals indicated in the drawing, the ions accumulate very rapidly. Thus, in addition to the elimination of undesired ions and the increase in sensitivity of the spectroscopic technique, a considerable savings of time is effected as compared to the heretofore usually necessary repetition of the measurements for the purpose of producing a sufficient number of signals.

As indicated in FIG. 4, at indirect ionization, the excitation of the ions by the HF selection field in the phase $A_n$ occurs only after a certain time has passed after producing the primary ions by means of the electron beam which is operative only momentarily, because a certain time is needed for the primary ions to produce a sufficient quantity of secondary ions. Again, the selection process may be repeated several times to obtain an enrichment of the concentration of the desired ions in the measuring cell.

In the embodiment of FIGS. 3 and 4, a HF selection field having several discrete frequencies was applied in timely succession in order to eliminate the ions having corresponding cyclotron resonance frequencies. In its stead it would also be possible to use a modulated HF signal for establishing the HF selection field which has frequencies encompassing a larger frequency range so that all ions can be eliminated which have cyclotron resonance frequencies that are within this range. By this technique it is possible to eliminate those ions which are outside a predetermined frequency range that includes the ions of interest to the projected study.

We claim:

1. A method of ion cyclotron resonance respectroscopy, comprising the steps of providing a gaseous sample substance contained in a measuring cell;

exposing said substance to a constant magnetic field in a predetermined direction;

subjecting said sample substance to a plurality of successive selection cycles in which each cycle comprises ionizing said substance, subjecting said substance to an electrical radio frequency selection field oriented orthogonally to the direction of said magnetic field and having at least one frequency corresponding to the cyclotron resonance frequency of at least one undesired species of ions in said sample substance, said sample substance being exposed to said radio frequency selection field for a period of time until the orbital radii of the undesired ions have reached a magnitude at which said undesired ions collide with the walls of the measuring cell and are thereby eliminated;

said radio frequency selection field being limited to frequencies other than a cyclotron resonance frequency of a desirable species of ions in said sample substance;

and subsequently subjecting said sample substance to an electrical radio frequency measuring field oriented orthogonally to the direction of said magnetic field and having a frequency corresponding to the cyclotron resonance frequency of the desirable ions for measuring the desirable ions, whereby the concentration of the desirable ions in the measuring cell is increased by the successive selection cycles.

2. A method according to claim 1, in which the radio frequency selection field of each selection cycle comprises a plurality of frequencies corresponding with the cyclotron resonance frequencies of a plurality of undesired ions for eliminating such ions.

3. A method according to claim 1, in which the radio frequency selection field of each selection cycle comprises a plurality of discrete frequencies corresponding with the cyclotron resonance frequencies of a plurality of undesired ions for eliminating such ions.

4. A method according to claim 1, in which
said radio frequency selection field of each selection cycle comprises a wide band of frequencies encompassing a wide range of cyclotron resonance frequencies for eliminating a wide range of undesired ions,
said wide band of frequencies lying outside a predetermined frequency window corresponding with the cyclotron resonance frequency of the desirable ions.

5. A method according to claim 1, in which
said sample substance is subjected to several of said successive selection cycles.

6. A method according to claim 1, in which
the radio frequency selection field is applied for at least part of the time during which the ionization of the sample substance takes place in each selection cycle.

7. A method according to claim 1, in which
the radio frequency selection field is applied subsequent to the ionizing step during each selection cycle.

8. A method according to claim 1, including
the step of conducting a test measurement, prior to said selection cycles, for determining the cyclotron resonance frequencies of the undesired ions in said sample substance,
each selection cycle including the step of automatically establishing said radio frequency selection field with frequencies corresponding with the cyclotron resonance frequencies of the undesired ions as determined by said test measurement.

* * * * *